United States Patent [19]
Lee et al.

[11] Patent Number: 5,808,957
[45] Date of Patent: Sep. 15, 1998

[54] ADDRESS BUFFERS OF SEMICONDUCTOR MEMORY DEVICE

[75] Inventors: Jung-hwa Lee; Jin-man Han; Se-jin Jeong, all of Seoul, Rep. of Korea

[73] Assignee: Samsung Electronics Co., Ltd., Kyungki-Do, Rep. of Korea

[21] Appl. No.: 632,594

[22] Filed: Apr. 15, 1996

[30] Foreign Application Priority Data

Apr. 14, 1995 [KR] Rep. of Korea .................. 95-8817

[51] Int. Cl.$^6$ ........................................ G11C 8/00
[52] U.S. Cl. ........................ 365/230.08; 365/198
[58] Field of Search ............... 365/230.08; 326/65; 327/333

[56] References Cited

U.S. PATENT DOCUMENTS

| 3,795,898 | 3/1974 | Mehta et al. | 365/230.08 |
| 4,984,202 | 1/1991 | Kawahara | 365/203 |
| 5,305,282 | 4/1994 | Choi | 365/230.08 |
| 5,515,334 | 5/1996 | Kotani et al. | 365/230.08 |

*Primary Examiner*—David C. Nelms
*Assistant Examiner*—Michael T. Tran
*Attorney, Agent, or Firm*—Cushman Darby & Cushman IP Group of Pillsbury Madison & Sutro LLP

[57] ABSTRACT

Address buffers of a semiconductor memory device have a switching section for switching into each other transmission routes of first and second address signals input from outside in response to predetermined control signals. The signals allow input of the address signals and set the operating mode of the semiconductor memory device.

13 Claims, 4 Drawing Sheets

ADDRESS BUFFERS OF SEMICONDUCTOR MEMORY DEVICE

BACKGROUND OF THE INVENTION

1. Field of the Invention

The present invention relates to semiconductor memory device buffers. More particularly, the present invention relates to address buffers in which TTL level address signals are changed into CMOS level address signals.

2. Description of the Related Art

In semiconductor memory devices, especially in dynamic random access memories, row addresses and column addresses are serially input in an address-multiplex system and are controlled by row address strobe signals ("RASB") and column address strobe signals ("CASB"), respectively.

To reduce the access time for reading out or writing in the computer memory, the column addresses are not controlled directly by the column address strobe signals CASB but are controlled in response to a signal indicating that input of row address by the row address strobe signals RASB is complete.

FIG. 1 depicts one embodiment of a conventional column address buffer used in a semiconductor memory device. An address signal input through an address path Ai, is sent to a TTL (transistor-transistor logic) input section 100 upon control of a signal øRAL which indicates that input of row address has been completed. An output signal of a NAND gate 1 of the TTL input section 100 is transmitted to a driving section 102 upon control of a signal øYALB for activating a column address in a signal transmission and latch section 101. After transmission, a transmission gate 2 is turned off by the signal øYALB to cut off any transmission from the TTL input section 100. The current signal-logic state is maintained by a latching operation of a transmission gate 4 and inverters 5 and 6 until a new TTL level signal controlled by either RASB or CASB is input.

Since the number of address pins used for the performance of the chip depends on a refresh cycle, a bit construction or the number of bits disregarded in a parallel test of bit stream, preferably, the addresses input through the path, e.g. A0, A1, ... , An-1, An, are scrambled to a structure of A3, A4, An-1, An, ... , A0, A1 in a coding range inside of the chip.

In the address buffer shown in FIG. 1, the address scrambling operation described above becomes complicated because signals are required to control each operating mode, input or output signals of the address buffers may be connected to power (Vcc or Vss), or the signal-mutual switching operation may be complicated. Further, because this input operation requires intricate circuitry, the chip performance speed is decreased.

SUMMARY OF THE INVENTION

The present invention is intended to overcome these and other disadvantages of conventional semiconductor memory device address buffers.

Accordingly, it is an object of the present invention to provide address buffers for a semiconductor memory device which efficiently performs an address scrambling operation according to various operating modes.

It is another object of the present invention to provide address buffers for a semiconductor memory device that are designed to be simple in structure, and which efficiently perform an address scrambling operation according to various operating modes.

In order to achieve these objects, the address buffers for a semiconductor memory device of this invention include a switching section for switching transmission routes of first and second address signals externally input in response to predetermined control signals, which control signals allow input of the address signals and set operating modes of the semiconductor memory device.

BRIEF DESCRIPTION OF THE DRAWINGS

The preferred embodiments of the present invention will now be described more specifically with reference to the attached drawings, wherein.

DETAILED DESCRIPTION OF THE PREFERRED EMBODIMENTS

Address buffers of a semiconductor memory device according to the present invention will be described in detail with reference to the accompanying drawings.

Figure 2:
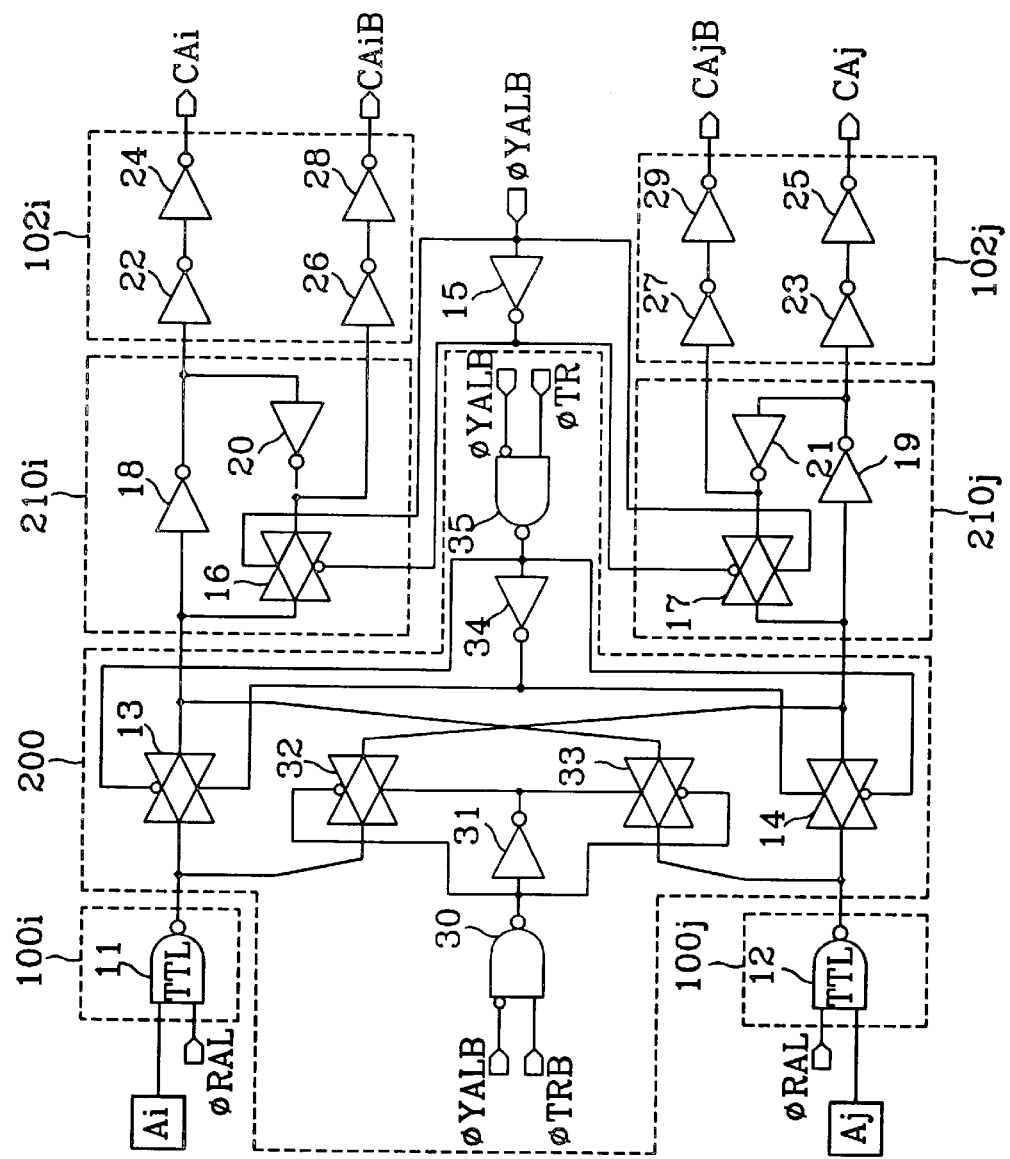
FIG. 2 is a schematic block diagram of address buffers of a semiconductor memory device in accordance with a preferred embodiment of the present invention.

As shown in FIG. 2, address buffers according to a preferred embodiment of this invention are designed to switch and mutually transmit address signals so that each address signal can pass through one of two different address buffers.

A first TTL input section 100$i$ has a NAND gate 11 with input terminals connected to an address path Ai and a signal øRAL which indicates that input of row address has been completed. A first latch section 210$i$, and a first driving section 102$i$ are used for the first address buffer only.

A second TTL input section 100$j$ has a NAND gate 12 with input terminals connected to an address path Aj and the signal øRAL. A second latch section 210$j$, and a second driving section 102$j$ are used for the second address buffer only.

A switching section 200 used for signal-mutual switching includes a first CMOS (complementary metal oxide semiconductor) transmission gate 13 connected between the first TTL input section 100$i$ and the first latch section 210$i$, a second CMOS transmission gate 32 connected between the first TTL input section 100$i$ and the second latch section 210$j$, a third CMOS transmission gate 33 connected between the second TTL input section 100$j$ and the first latch section 210$i$, and a fourth CMOS transmission gate 14 connected between the second TTL input section 100$j$ and the second latch section 210$j$.

The first CMOS transmission gate 13 has a P type electrode connected to an output terminal of a NAND gate 35 to receive the inverse of øYALB and an operating-mode setting signal øTR for activating input of a column addresses. An N type electrode is connected to an output terminal of an inverter 34 to receive an output signal from the NAND gate 35.

The second CMOS transmission gate 32 has a P type electrode connected to an output terminal of a NAND gate 30 to receive the inverse of øYALB and øTRB, a logic-inverting signal of the operating-mode setting signal øTR for activating input of column addresses. An N type electrode is connected to an output terminal of an inverter 31 to receive an output signal from the NAND gate 30.

The third CMOS transmission gate 33 has a P type electrode connected to the output terminal of the NAND gate 30 to receive the inverse of øYALB and the signal øTRB, and an N type electrode connected to the output terminal of the inverter 31 to receive the output signal from the NAND gate 30.

The fourth CMOS transmission gate 14 has a P type electrode connected to the output terminal of the NAND gate 35 to receive the inverse of øYALB and the mode-setting signal øTR, and an N type electrode connected to the output terminal of the inverter 34 to receive the output signal from the NAND gate 35.

The first latch section 210$i$ includes an inverter 18 having an input terminal connected to the first CMOS transmission gate 13, an inverter 20 having an input terminal connected to an output terminal of the inverter 18, and a CMOS transmission gate 16 connected between an output terminal of the inverter 20 and the input terminal of the inverter 18.

The second latch section 210$j$ includes an inverter 19 having an input terminal connected to the fourth CMOS is transmission gate 14, an inverter 21 having an input terminal connected to an output terminal of the inverter 19, and a CMOS transmission gate 17 connected between an output terminal of the inverter 21 and the input terminal of the inverter 19.

The N type electrodes of the CMOS transmission gates 16 and 17 are commonly connected to the signal øYALB, and their P type electrodes are commonly connected to an output terminal of an inverter 15 which receives the signal øYALB.

The first driving section 102$i$ includes inverters 22 and 24 connected in series to the output terminal of the inverter 18, and inverters 26 and 28 connected in series to the output terminal of the inverter 20. The inverters 24 and 28 produce column address signals CAi and CAiB, respectively.

The second driving section 102$j$ includes inverters 23 and 25 connected in series to the output terminal of the inverter 19, and inverters 27 and 29 connected in series to the output terminal of the inverter 21. The inverters 25 and 29 produce column address signals CAj and CAjB, respectively.

When the input of row addresses is completed, the signal øRAL is a logic high level, and address signals are input to the first and second TTL input sections 100$i$ and 100$j$ from the address paths Ai and Aj. As the signals øYALB maintain the active state of low level, the NAND gates 30 and 35 are in an active state, and the CMOS transmission gates 16 and 17 of each latch section 210$i$ and 210$j$ are turned off.

When the operating-mode setting signal øTR attains a high level (the signal øTRB attains a low level), the output signal of the NAND gate 35 attains a low level to turn on the first and fourth CMOS transmission gates 13 and 14.

Each address signal input through the address paths Ai and Aj then passes through the first and fourth CMOS transmission gates 13 and 14 to be produced as CAi and CAiB, and CAj and CAiB. The second and third CMOS transmission gates 32 and 33 are turned off since the output signal of the NAND gate 30 attains a high level.

When the signal øTR attains a low level (the signal øTRB attains a high level), the second and third CMOS transmission gates 32 and 33 are turned on, and the first and fourth CMOS transmission gates 13 and 14 are turned off. Accordingly, the address signal input through the address path Ai, is produced as the column address signals CAj and CAjB, and the address signal input from the address path Aj, is generated as the column address signals CAi and CAiB. The signal øYALB attains a high level after the address signal is transmitted, and the CMOS transmission gates 16 and 17 are turned on to activate the first and second latch sections.

Figure 3:
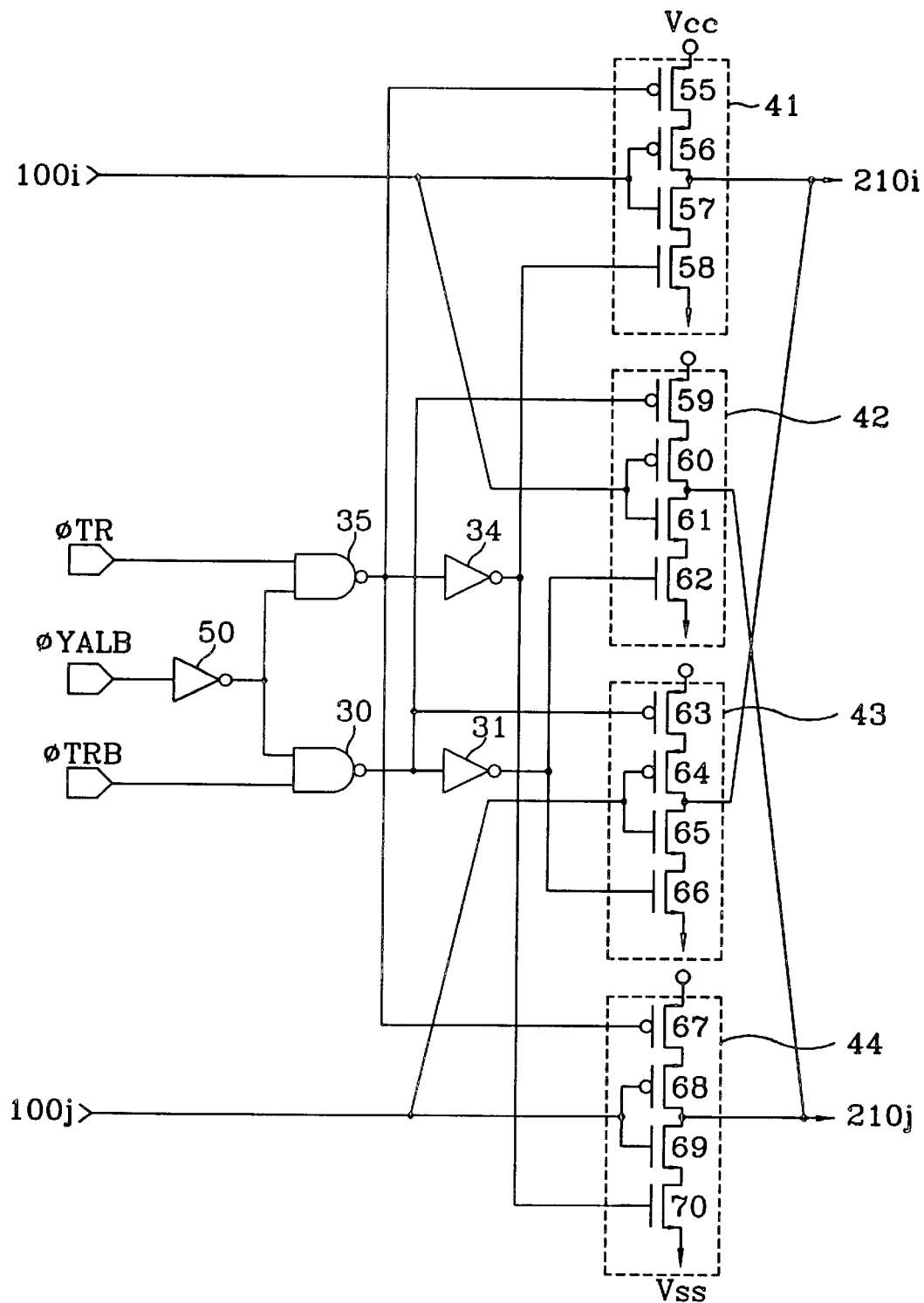
FIG. 3 is a block diagram of a signal-switching section of FIG. 2 in accordance with one embodiment of the present invention.

FIG. 3 is a block diagram of a signal-switching section of FIG. 2 in accordance with one embodiment of the present invention. Throughout FIGS. 2 and 3, similar reference numerals denote similar elements. Clocked inverters including pull-up PMOS transistors 55, 59, 63 and 67, and pull-down NMOS transistors 58, 62, 66 and 70, are used in this embodiment of FIG. 3, instead of the CMOS transmission gates of FIG. 2.

A first inverter 41 connected between the first TTL input section 100$i$ and the first latch section 210$i$, includes a pull-up PMOS transistor 55 having its gate connected to an output terminal of the NAND gate 35, and a pull-down NMOS transistor 58 having its gate connected to an output of the inverter 34.

A second inverter 42 is connected between the first TTL input section 100$i$ and the second latch section 210$j$, and includes a pull-up PMOS transistor 59 having its gate connected to an output terminal of the NAND gate 30, and a pull-down NMOS transistor 62 having its gate connected to an output terminal of the inverter 31.

A third inverter 43 is connected between the second TTL input section 100$j$ and the first latch section 210$i$, and includes a pull-up PMOS transistor 63 having its gate connected to the output terminal of the NAND gate 30, and a pull-down NMOS transistor 66 having its gate connected to the output terminal of the inverter 31.

A fourth inverter 44 is connected between the second TTL input section 100$j$ and the second latch section 210$j$, and includes a pull-up PMOS transistor 67 having its gate connected to the output terminal of the NAND gate 35, and a pull-down NMOS transistor 70 having its gate connected to the output terminal of the inverter 34.

The description of the operation of the switching sections of the address buffers of FIG. 3 is the same as that of FIG. 2.

Figure 1:
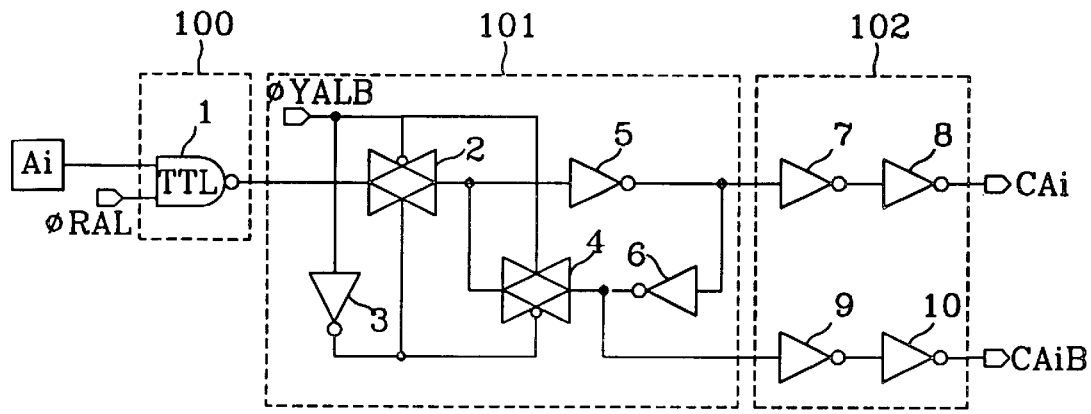
FIG. 1 is a schematic block diagram of a conventional address buffer of a semiconductor memory device.
Figure 4:
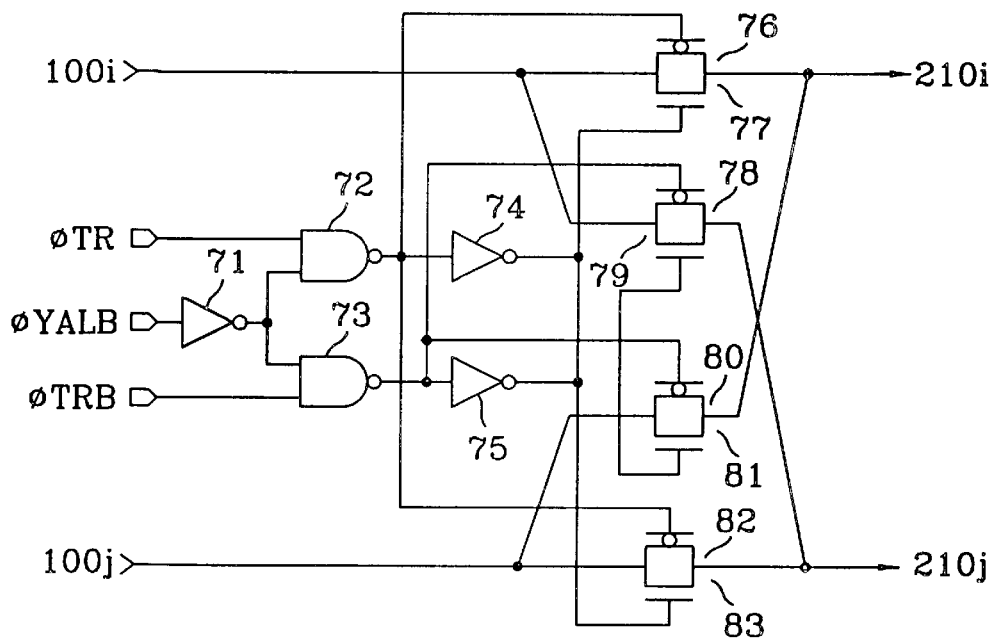
FIG. 4 is a block diagram of a signal-switching section of FIG. 2 in accordance with another embodiment of the present invention.

As shown in FIG. 4, another embodiment of a switching section may be formed by using PMOS and NMOS transmission gates 76–83 instead of transmission gates 41–44. The connections in this circuit are essentially identical to those in the circuit shown in FIG. 3.

Figure 5:
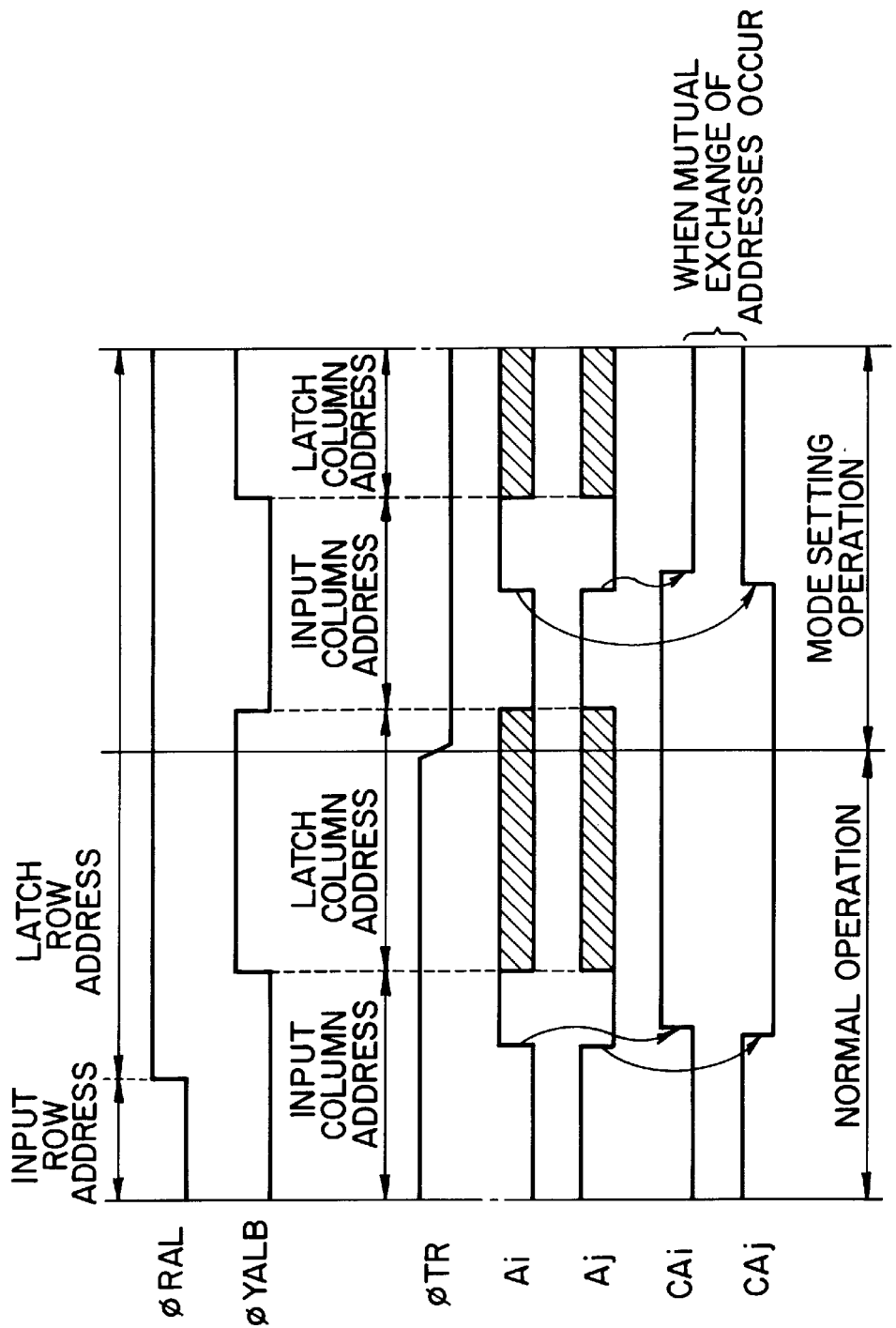
FIG. 5 is a timing diagram illustrating a normal operation and a mode setting operation of the present invention.

Operation of these devices will now be given with reference to the timing diagram in FIG. 5.

During normal operation, the signal øTR is at the logic high level and the signal øYALB is at the logic low level. In this case, a signal of the first TTL input section 100$i$ is transmitted to the first latch section 210$i$ through the transmission gates 76 and 77 and a signal of the second TTL input section 100$j$ is transmitted to the second latch section 210$j$ through transmission gates 82 and 83.

Likewise, during the mode setting operation, the signal øTR is at the logic low level and the signal øYALB is at the logic low level, so that the signal of the first TTL input section 100$i$ is transmitted to the second latch section 210$j$ through the transmission gates 78 and 79 and the signal of the second TTL input section 100$j$ is transmitted to the first latch section 210$i$ through transmission gates 80 and 81. Consequently, the input address signals are reversely transmitted.

As mentioned above, the present invention allows mutual switching of address signals from each address buffer with its simple circuit construction to enhance efficiency of address-scrambling operation in accordance with various operating modes.

This application claims priority from Korean Application No. 8817-1995, the content of which is hereby incorporated by reference.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. An address buffer of a semiconductor memory device, comprising:

a switching element which switches transmission routes of first and second address signals in response to predetermined control signals, said predetermined control signals allowing input of said first and second address signals to be transmitted to first and second locations, respectively, during a normal mode of operation or to said second and first locations, respectively, during a reverse mode of operation, and signals for selecting the mode of operation of the semiconductor memory device.

2. An address buffer of a semiconductor memory device, comprising:

a first input section for changing a level of a first address signal into a CMOS level;

a second input section for changing a level of a second address signal into a CMOS level; and a switching element which switches transmission routes of said first and second address signals between normal and reverse modes of operation in response to predetermined control signals.

3. The address buffer of claim 2, wherein said predetermined control signals relate to signals for allowing input of said first and second address signals and signals for setting the mode of operation of the semiconductor memory device.

4. The address buffer of claim 3, further comprising latches in which each transmission route is controlled by said signals for allowing input of said first and second address signals.

5. A semiconductor memory device having a plurality of address buffers for changing first and second address signals input from outside into internal CMOS level address signals and respectively transmitting said internal address signals, said semiconductor memory device comprising means for switching transmission routes of said first and second address signals between normal and reverse modes of operation in response to predetermined control signals.

6. The semiconductor memory device of claim 5, wherein said predetermined control signals relate to signals for allowing input of said address signals and signals for setting the mode of operation of the semiconductor memory device.

7. The semiconductor memory device of claim 5, wherein said switching means comprises at least four CMOS transmission gates.

8. The semiconductor memory device of claim 5, wherein said switching means comprises at least one of PMOS and NMOS transistors.

9. A semiconductor memory device, comprising:

a first input section which receives a first address signal;

a second input section which receives a second address signal; and a switching circuit having first and second output nodes for receiving said first address signal and said second address signal from said first and second input sections and outputting a first output signal and a second output signal at said first and second output nodes, said switching circuit including switching elements for switching transmission routes between normal and reverse modes of operation to transmit said first address signal between said first output node and said second output node during said normal mode of operation and for switching said second address signal between said second output node and said first output node during said reverse mode of operation, said first address signal and said second address signal being switched by said switching elements such that only one of said first address signal and said second address signal is connected to said first output node at any particular point in time, and said first address signal and said second address signal being switched by said switching elements such that only one of said first address signal and said second address signal is connected to said second output node at said particular point in time.

10. The semiconductor memory device of claim 9, further comprising a first latch section and a second latch section which respectively receive said first output signal and said second output signal and which each generate at least one driving signal.

11. The semiconductor memory device of claim 9, wherein said switching section comprises:

a first input node to which said first address signal is received;

a second input node to which said second address signal is received;

a first switch connected between said first input node and said first output node;

a second switch connected between said first input node and said second output node;

a third switch connected between said second input node and said first output node; and a fourth switch connected between said second input node and said second output node.

12. The semiconductor memory device of claim 11, wherein said first, second, third and fourth switches are CMOS transistors.

13. The semiconductor memory device of claim 11, wherein said first, second, third and fourth switches each include at least one transistor.

* * * * *